United States Patent
Wesselmann et al.

(10) Patent No.: US 9,433,104 B2
(45) Date of Patent: Aug. 30, 2016

(54) METHOD OF MANUFACTURING STRETCHABLE CIRCUIT ASSEMBLIES

(71) Applicant: Multi-Fineline Electronix, Inc., Irvine, CA (US)

(72) Inventors: Dale Wesselmann, Placentia, CA (US); Luis Chau, Irvine, CA (US); Chengkong Chris Wu, Franklin, WI (US)

(73) Assignee: MULTI-FINELINE ELECTRONIX, INC., Irvine, CA (US)

( * ) Notice: Subject to any disclaimer, the term of this patent is extended or adjusted under 35 U.S.C. 154(b) by 211 days.

(21) Appl. No.: 13/953,977

(22) Filed: Jul. 30, 2013

(65) Prior Publication Data
US 2013/0312256 A1 Nov. 28, 2013

Related U.S. Application Data

(62) Division of application No. 13/156,522, filed on Jun. 9, 2011, now Pat. No. 9,018,532.

(51) Int. Cl.
*H05K 3/36* (2006.01)
*H05K 1/02* (2006.01)
*H05K 1/14* (2006.01)

(52) U.S. Cl.
CPC ............ *H05K 3/36* (2013.01); *H05K 1/0283* (2013.01); *H05K 1/148* (2013.01); *H05K 2201/09781* (2013.01); *Y10T 29/49117* (2015.01); *Y10T 29/49124* (2015.01); *Y10T 29/49126* (2015.01)

(58) Field of Classification Search
CPC ................. H05K 3/361; H05K 1/148; Y10T 29/49124; Y10T 29/49117
See application file for complete search history.

(56) References Cited

U.S. PATENT DOCUMENTS 5,442,470 A * 8/1995 Hashimoto ...................... 349/58
2009/0317639 A1 * 12/2009 Axisa ..................... B32B 37/185
428/411.1

FOREIGN PATENT DOCUMENTS

WO   WO 2009/134823   * 11/2009   ............ H01R 13/24

OTHER PUBLICATIONS

Wesselmann et al., "Stretchable Circuit Assemblies", U.S. Appl. No. 13/156,522, filed Jun. 9, 2011.

* cited by examiner

*Primary Examiner* — Peter DungBa Vo
*Assistant Examiner* — Jeffrey T Carley
(74) *Attorney, Agent, or Firm* — Keating & Bennett, LLP

(57) ABSTRACT

A stretchable circuit assembly includes first and second printed circuit boards, discrete conductive wires or flexible circuits including ends connected to the first and second printed circuit boards, and a stretchable interconnect in which the discrete conductive wires or flexible circuits and a portion of the first and second printed circuit boards are embedded. Main surfaces of the flexible circuits are perpendicular or substantially perpendicular to main surfaces of the stretchable interconnect. A method of making a stretchable circuit assembly includes the steps of providing electrical interconnects, a first printed circuit board, and a second printed circuit board, shaping the electrical interconnects to have an oscillating configuration, and forming a stretchable interconnect such that the electrical interconnects, a portion of the first printed circuit board, and a portion of the second printed circuit board are embedded within the stretchable interconnect.

5 Claims, 10 Drawing Sheets

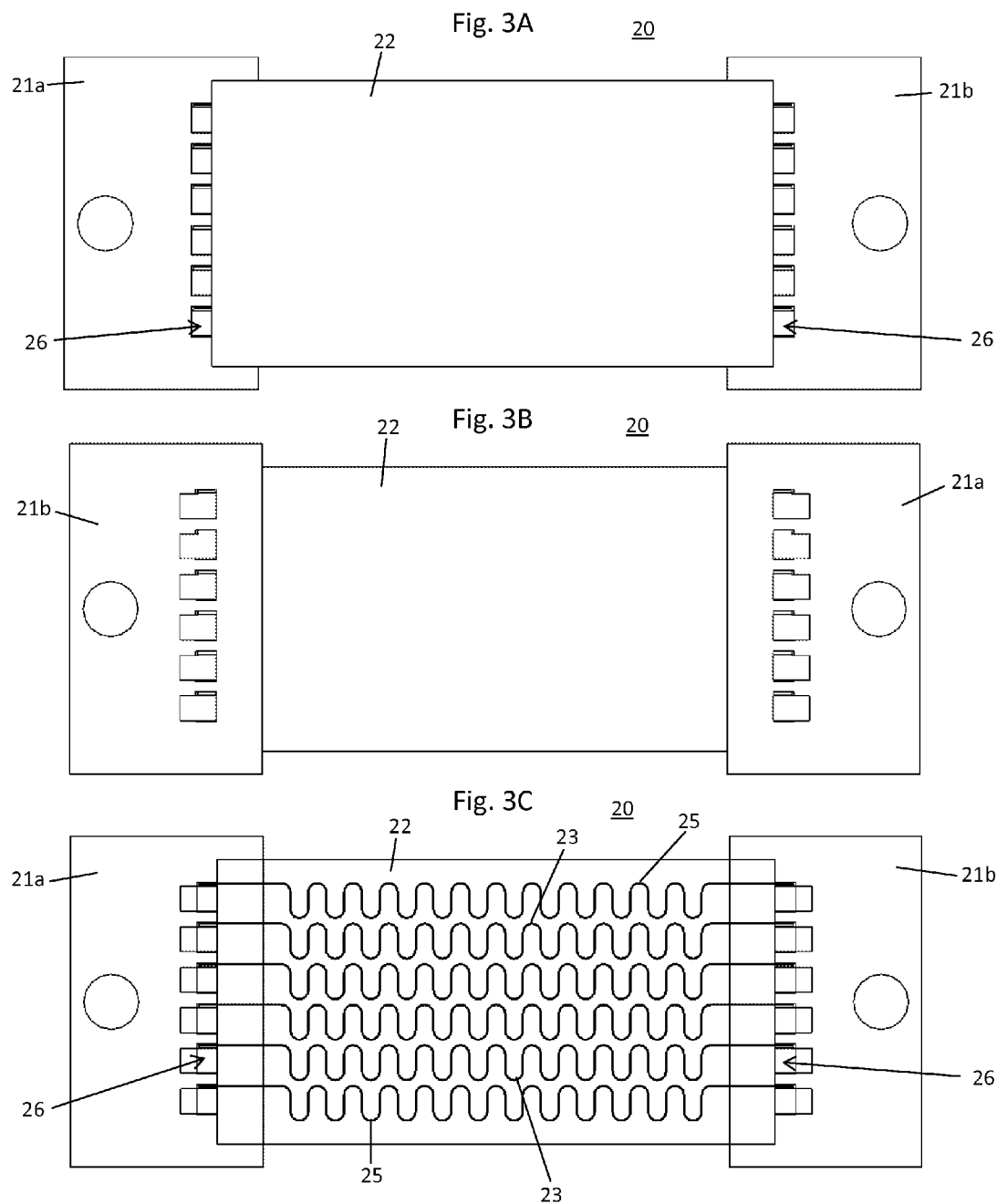

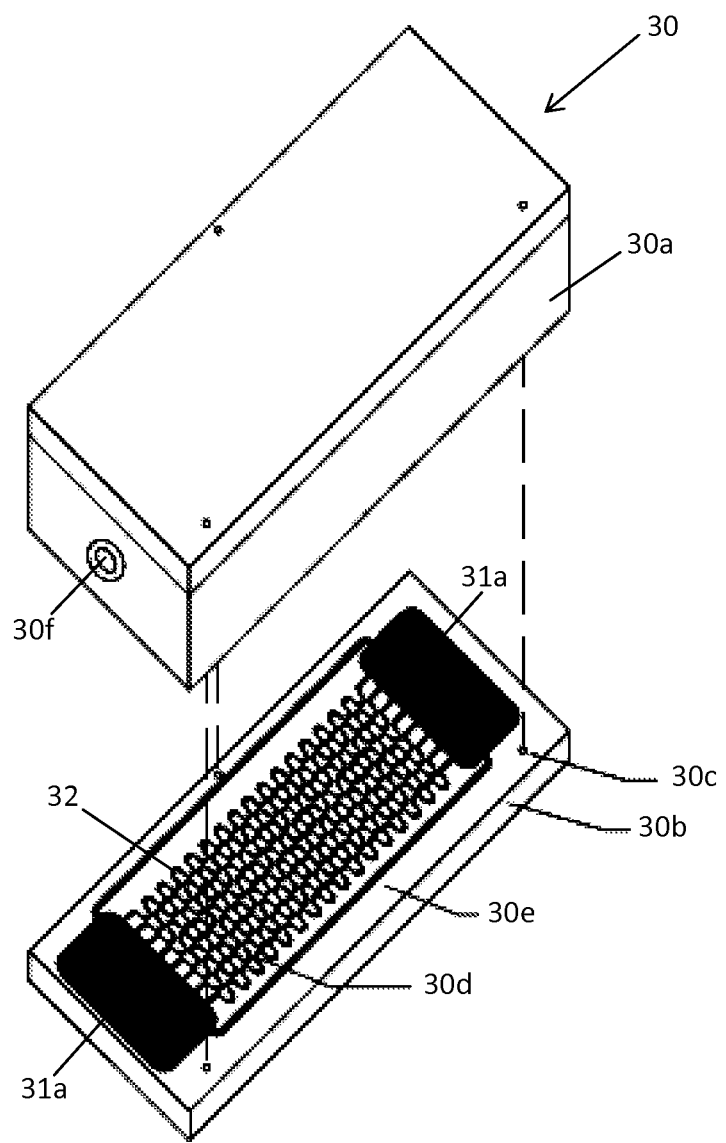

METHOD OF MANUFACTURING STRETCHABLE CIRCUIT ASSEMBLIES

BACKGROUND OF THE INVENTION

1. Field of the Invention

The present invention relates to stretchable circuits. More specifically, the present invention relates to stretchable circuits that are polymer based and include conductive wires or flexible circuits embedded in the stretchable circuits.

2. Description of the Related Art

Known flexible circuits are implemented using flexible printed circuits. While flexible circuits can bend, they cannot stretch. To offer electrical connections that can elongate, flexible circuits are folded so that they can slide. Such known flexible circuits can slide back and forth with a specified bend gap and are intended to last for more than 200,000 sliding cycles. As the bend gap of the flexible circuit decreases, the number of cycles before failure occurs reduces exponentially.

U.S. Pat. No. 7,337,012 B2 teaches a stretchable circuit including a stretchable polymer body with micro-channels that are filled with conductive material. U.S. Pat. No. 7,337,012 B2 does not discuss the electrical terminals necessary to connect the stretchable circuit to other components. U.S. Pat. No. 7,337,012 B2 uses a conductor that is in liquid or paste form. The micro-channels are created in the substrate, and then the conductor is formed by forcing the liquid or paste into the micro-channels. Thus, the conductor takes the shape of the micro-channels. The liquids and pastes used in U.S. Pat. No. 7,337,012 B2 have a much higher bulk resistivity, in the range of three to ten times, than the bulk resistivity of copper wire. A higher resistance produces a lower performing circuit, which will not be suitable for many electronic applications.

U.S. Patent Application Publication No. 2009/0317639 A1 teaches conventional stretchable circuits using flexible circuits. The stretchable circuits are formed by laser cutting or die cutting the flexible circuits to form patterns in the flexible circuits. Portions of the flexible circuit are then removed to define stretchable conductive elements. This conventional stretchable circuit is then embedded in a polymer. However, in this conventional stretchable circuit, the flexible circuit and the conductive patterns are on the same plane, which causes the thickness of the polymer to be greater than optimal. Further, this stretchable circuit does not use conductive wires.

International Patent Application No. WO 2010/086034 A1 also teaches a conventional stretchable circuit. Portions of the stretchable circuit have different stiffnesses, which allows the stretchable circuit to stretch. To form the stretchable circuit, flexible circuits are laser cut, and the portions of the flexible circuits that are not needed are removed. The resulting stretchable circuit is then embedded in polymer. The conductive patterns are on the same plane as the body of the circuit, which causes the thickness of the polymer to be greater than optimal.

SUMMARY OF THE INVENTION

To overcome the problems described above, preferred embodiments of the present invention provide a stretchable circuit assembly including conductive wires or flexible circuits embedded within a stretchable interconnect.

In a first preferred embodiment of the present invention, a stretchable circuit assembly includes first and second printed circuit boards, discrete conductive wires including ends connected to the first and second printed circuit boards, and a stretchable interconnect in which the discrete conductive wires and a portion of the first and second printed circuit boards are embedded.

The stretchable circuit assembly preferably further includes a strain relief wire embedded in the stretchable interconnect and arranged to prevent the stretchable interconnect from being stretched such that the discrete conductive wires are damaged. The ends of the discrete conductive wires are preferably soldered to the first and second printed circuit boards. The discrete conductive wires preferably have an oscillating configuration. The discrete conductive wires preferably include semi-circular shaped portions connected by linear portions.

In a second preferred embodiment of the present invention, a stretchable circuit assembly includes first and second printed circuit boards, flexible circuits including ends connected to the first and second printed circuit boards, and a stretchable interconnect in which the flexible circuits and a portion of the first and second printed circuit boards are embedded. Main surfaces of the flexible circuits are perpendicular or substantially perpendicular to main surfaces of the stretchable interconnect.

The stretchable circuit assembly preferably further includes a strain relief circuit embedded in the stretchable interconnect and arranged to prevent the stretchable interconnect from being stretched such that the flexible circuits are damaged. Ends of the flexible circuits are preferably soldered to the first and second printed circuit boards. The flexible circuits preferably have an oscillating configuration. The flexible circuits preferably include semi-circular shaped portions connected by linear portions.

In a third preferred embodiment of the present invention, a method of making a stretchable circuit assembly includes the steps of providing electrical interconnects, a first printed circuit board, and a second printed circuit board; shaping the electrical interconnects to have an oscillating configuration; and forming a stretchable interconnect such that the electrical interconnects, a portion of the first printed circuit board, and a portion of the second printed circuit board are embedded within the stretchable interconnect.

The electrical interconnects preferably include one of conductive wires and flexible circuits. The step of forming a stretchable interconnect is preferably performed by injection molding. The step of forming a stretchable interconnect preferably uses a polymer. The method of making a stretchable circuit assembly preferably further includes the step of attaching ends of the electrical interconnects to the first printed circuit board and the second printed circuit board.

The above and other features, elements, characteristics and advantages of the present invention will become more apparent from the following detailed description of preferred embodiments of the present invention with reference to the attached drawings.

BRIEF DESCRIPTION OF THE DRAWINGS

FIG. 3A is a top plan view of a stretchable circuit assembly according to a second preferred embodiment of the present invention.

FIG. 3B is a bottom plan view of a stretchable circuit assembly according to a second preferred embodiment of the present invention.

FIG. 3C is a top plan view of a stretchable circuit assembly showing the flexible circuits according to a second preferred embodiment of the present invention.

FIGS. 5A and 5B show an injection mold used in a method of manufacturing a stretchable circuit assembly according to a third preferred embodiment of the present invention.

DETAILED DESCRIPTION OF PREFERRED EMBODIMENTS

Figure 1A:
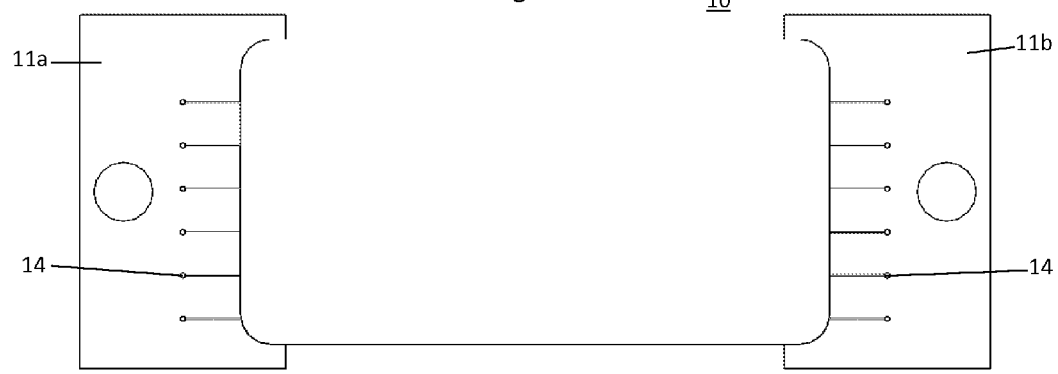
FIG. 1A is a top plan view of a stretchable circuit assembly according to a first preferred embodiment of the present invention.
Figure 1B:
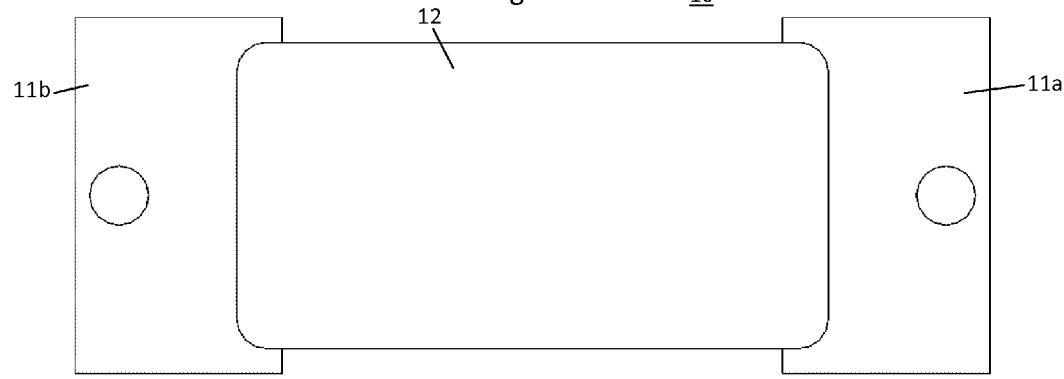
FIG. 1B is a bottom plan view of a stretchable circuit assembly according to a first preferred embodiment of the present invention.

FIGS. 1A-2B show a stretchable circuit assembly 10 with conductive wires 13 according to a first preferred embodiment of the present invention. FIGS. 3A-4B show a stretchable circuit assembly 20 with flexible circuits 23 according to a second preferred embodiment of the present invention. FIGS. 5A-8B show a method of manufacturing a stretchable circuit assembly according to a third preferred embodiment of the present invention.

Stretchable Circuit Assembly with Conductive Wires

FIGS. 1A-2B show a stretchable circuit assembly 10 according to a first preferred embodiment of the present invention. The stretchable circuit assembly 10 includes two printed circuit boards 11a, 11b, a stretchable interconnect 12 connected between the two printed circuit boards 11a, 11b, and conductive wires 13 connected to the two printed circuit boards 11a, 11b and embedded within the stretchable interconnect 12.

The stretchable interconnect 12 is preferably formed such that the conductive wires 13 and the two printed circuit boards 11a, 11b are embedded within the stretchable interconnect 12. The stretchable interconnect 12 is made of a material that is stretchable so that the distance between the two printed circuit boards 11a, 11b can be increased by stretching the stretchable interconnect 12. The stretchable interconnect 12 is preferably a polymer such as polydimethylsiloxane (PDMS); however, other suitable stretchable materials, such as urethane, polyurethane elastomers, hydrocarbon rubber/elastomers, and polyether block amides (PEBA), can also be used.

Although only one stretchable interconnect 12 is shown in FIGS. 1A-2B connecting the two printed circuit boards 11a, 11b, it is possible to have more than one stretchable interconnect connecting two printed circuit boards. Although only two printed circuit boards 11a, 11b are shown in FIGS. 1A-2B, it is also possible to connect more than two printed circuit boards. For example, two stretchable interconnects could connect three printed circuit boards together in a chain, with two sides of a middle printed circuit board connected to one of the stretchable interconnects that is connected to a printed circuit board at the end of the chain. Another example is for two stretchable interconnects to be connected at one end to the same side of the same printed circuit board and at the other end to separate printed circuit boards. It is also possible to use an adhesive to more securely attach the stretchable interconnect 12 to the two printed circuit boards 11a, 11b. Any suitable adhesive can be used.

The conductive wires 13 are preferably attached to the printed circuit boards 11a, 11b by using solder 14. However, the conductive wires 13 could be attached to the printed circuit boards 11a, 11b using any suitable method. For example, the conductive wires 13 could be attached to the printed circuit boards 11a, 11b by bonding with electrically conductive epoxy adhesive, clamping, pressure fittings, and crimping. The conductive wires 13 can be made of any suitable conductive material. The conductive wires 13 are preferably made of a conductive metal such as copper, silver, gold, or aluminum. The conductive wires 13 can be coated or uncoated. If the conductive wires 13 are not coated, then the stretchable interconnect 12 acts as a dielectric between the individual conductive wires 13 to prevent shorting between adjacent conductive wires 13. The conductive wires 13 are preferably discrete wires that are fabricated in bulk for commercial sale. That is, the conductive wires 13 are shaped and formed before being embedded in the stretchable interconnect 12 as compared to the conductors formed in U.S. Pat. No. 7,337,012 B2 by forcing a liquid or paste into micro-channels in a substrate.

Although not shown in the figures, it is possible to have more than one conductive line 13 that have the same shape when viewed in plan view but that are vertically separated from each other when viewed in a cross-sectional view. For example, two conductive lines 13 could be used, with one of the conductive lines 13 soldered to the top of the printed circuit boards 11a, 11b and with the other of the conductive lines 13 soldered to the bottom of the printed circuit boards 11a, 11b. Of course, having more than one conductive line 13 spaced apart from each other when viewed in cross-section requires that the stretchable interconnect 12 be thicker than when only one conductive line 13 is used.

Figure 1C:
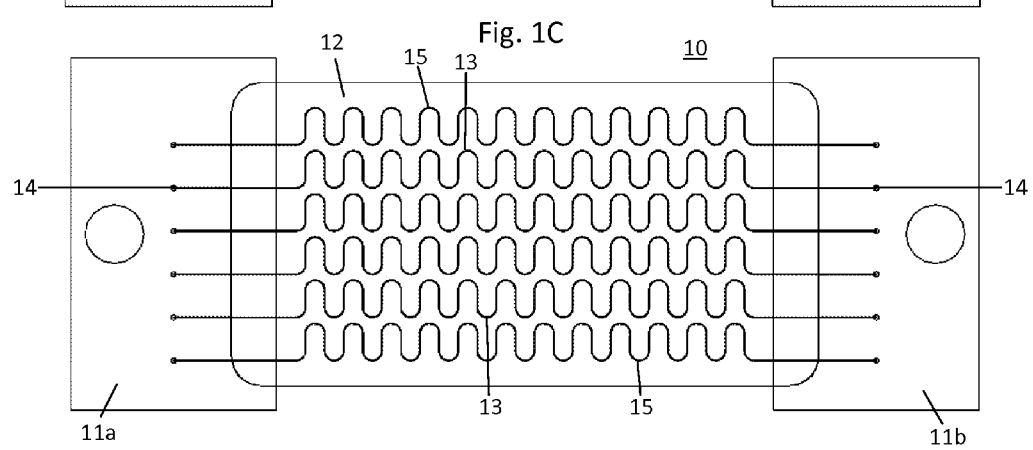
FIG. 1C is a top plan view of a stretchable circuit assembly showing the conductive wires according to a first preferred embodiment of the present invention.
Figure 2A:
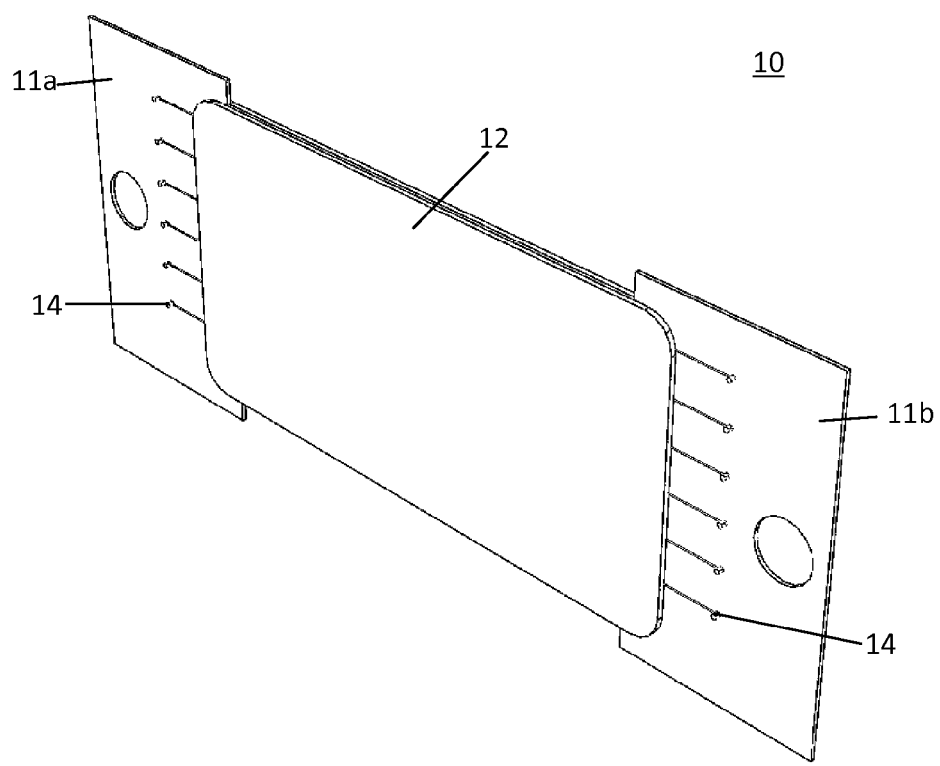
FIG. 2A is a perspective view of a stretchable circuit assembly according to a first preferred embodiment of the present invention.
Figure 2B:
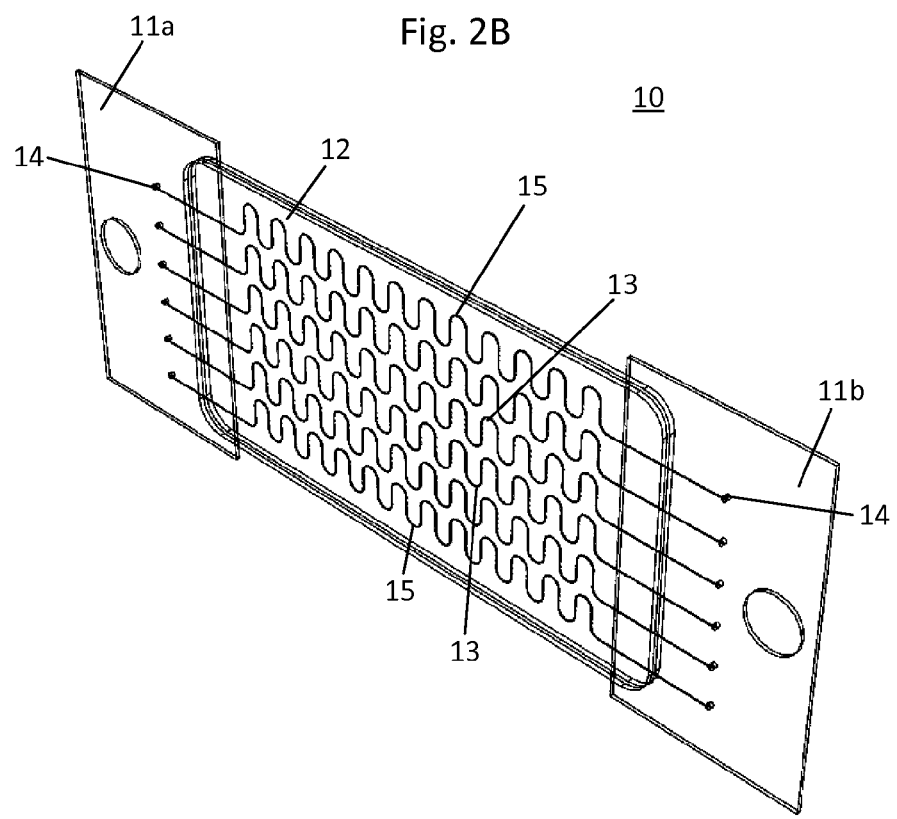
FIG. 2B is a perspective view of a stretchable circuit assembly showing the conductive wires according to a first preferred embodiment of the present invention.

In FIGS. 1C and 2B, the stretchable interconnect 12 is shown as see-through so that the shape of the conductive wires 13 can be seen. The conductive wires 13 preferably have an oscillating or meandering shape as shown in FIGS. 1C and 2B so that shape of the conductive wires 13 changes as the stretchable circuit assembly 10 is stretched in the direction between the printed circuit boards 11a, 11b. For example, the conductive wires 13 can have semi-circular portions connected with linear portions as shown in FIGS. 1C and 2B. Instead of semi-circular portions, the conductive wires 13 could have triangular portions or other similar shaped portions. It is also possible to not include linear portions in the conductive wires 13 and to have the semicircular portions, or other suitable shape connected to each other. Other configurations are also possible as long as the conductive wires 13 are not damaged and the signal integrity of the signals transmitted through the conductive wires 13 is maintained when the stretchable interconnect 12 is stretched. The stretch range of the stretchable circuit assembly 10 is typically between 0% and about 125% of the length of the stretchable interconnect 12.

One or more of the conductive wires 13 can be replaced by strain relief wires 15. The strain relief wires 15 prevent the stretchable interconnect 12 from being over stretched, which protects the conductive wires 13 from being damaged. Preferably, as shown in FIGS. 1A-2B, the top and bottom conductive wires 13 are replaced by strain relief wires 15. However, no strain relief wires 15 can be used; one strain relief wire 15, e.g., in the middle of the stretchable interconnect 12, can be used; and more than two relief wires 15, e.g., alternating with the conductive wires 13, can be used.

The strain relief wires 15 can be made of any suitable material, including, for example, a metal or carbon fiber. The strain relief wires 15 preferably have the same shape as the conductive wires 13 as shown in FIGS. 1A-2B; however, it also possible for the strain relief wires 15 to have a shape different from the conductive wires 13.

Any suitable printed circuit board can be used for the printed circuit boards 11a, 11b. Although not shown in FIGS. 1A-2B, the printed circuit boards 11a, 11b can include active or passive components for processing and/or modifying the signals transmitted through the stretchable circuit assembly 10. Although not shown in FIGS. 1A-2B, the printed circuit boards 11a, 11b preferably include an electrical connector for connecting the stretchable circuit assembly 10 to electrical devices with a corresponding electrical connector. The printed circuit boards 11a, 11b can be attached to an electronic device via surface mounted connectors such as board-to-board, clamping, pressure fittings, or spring pins, or can be embedded within a secondary printed circuit board, drilled, and copper plated to create a via interconnect.

Stretchable Circuit Assembly with Flexible Circuits

FIGS. 3A-4B show a stretchable circuit assembly 20 according to a second preferred embodiment of the present invention. The stretchable circuit assembly 20 includes two printed circuit boards 21a, 21b, a stretchable interconnect 22 connected between the two printed circuit boards 21a, 21b, and flexible circuits 23 connected to the two printed circuit boards 21a, 21b and embedded within the stretchable interconnect 22.

Figure 4A:
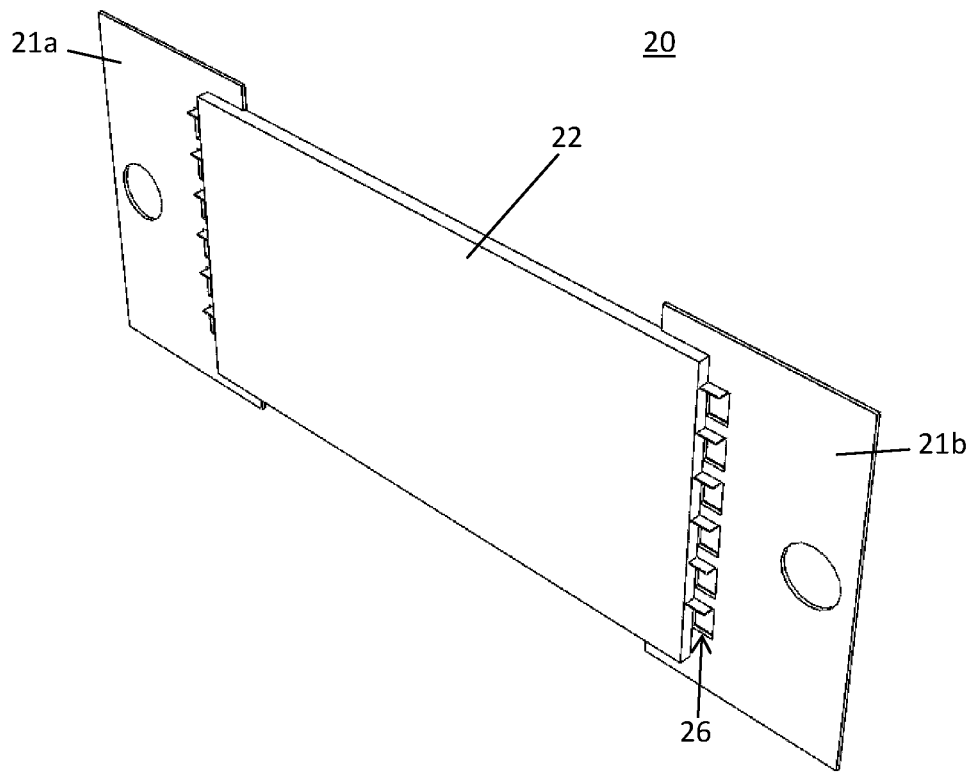
FIG. 4A is a perspective view of a stretchable circuit assembly according to a second preferred embodiment of the present invention.
Figure 4B:
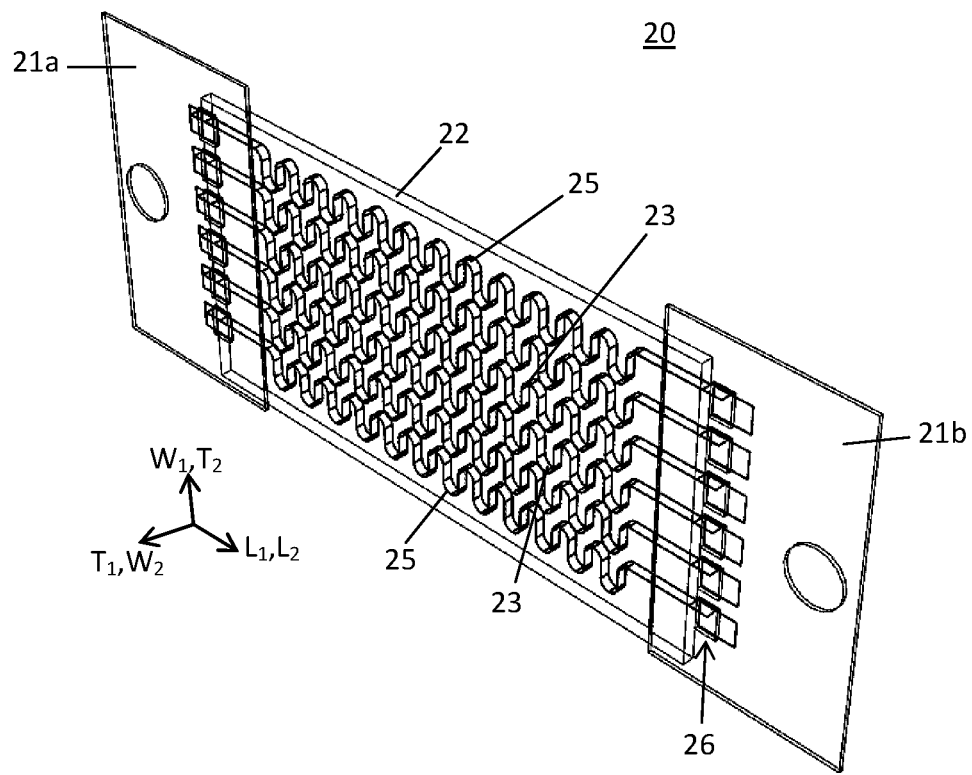
FIG. 4B is a perspective view of a stretchable circuit assembly showing the flexible circuits according to a second preferred embodiment of the present invention.

The stretchable interconnect 22 is preferably formed such that the flexible circuits 23 and the two printed circuit boards 21a, 21b are embedded within the stretchable interconnect 22. The flexible circuits 23 are preferably embedded within the stretchable interconnect 22 such that the main surfaces of the flexible circuits 23 are perpendicular or substantially perpendicular to the main surfaces of the stretchable interconnect 22. By arranging the main surface of the flexible circuits 23 perpendicular or substantially perpendicular to the main surface of the stretchable interconnect 22, it is possible to increase the length of the flexible circuits 23 without increasing the thickness of the stretchable interconnect 22. FIG. 4B shows axes for the thickness $T_1$, width $W_1$, and length $L_1$ of the stretchable interconnect 22 and for the thickness $T_2$, width $W_2$, and length $L_2$ of the flexible circuits 23. The thicknesses $T_1$, $T_2$ are in the smallest dimensions of the stretchable interconnect 22 and flexible circuits 23, respectively. Because the thicknesses $T_1$, $T_2$ are perpendicular or substantially perpendicular (i.e., the thickness $T_1$ of the stretchable interconnect 22 and the width $W_2$ of the flexible circuits 23 are parallel or substantially parallel), the width $W_2$ of the flexible circuit 23 and the thickness $T_1$ of the stretchable interconnect 22 can be substantially the same. Because of the oscillating shape of the flexible circuits 23, when the length of the flexible circuits 23 is increased, it might be necessary to increase the width of the stretchable interconnect 22. By increasing the length of the flexible circuits 23, the stretch range of the stretchable circuit assembly 20 is increased.

The stretchable interconnect 22 is made of a material that is stretchable so that the distance between the two printed circuit boards 21a, 21b can be increased by stretching the stretchable interconnect 22. The stretchable interconnect 22 is preferably a polymer such as polydimethylsiloxane (PDMS); however, other suitable stretchable materials, such as urethane, polyurethane elastomers, hydrocarbon rubber/elastomers, and polyether block amides (PEBA), can also be used.

Although only one stretchable interconnect 22 is shown in FIGS. 3A-4B connecting the two printed circuit boards 21a, 21b, it is possible to have more than one stretchable interconnect connecting two printed circuit boards. Although only two printed circuit boards 21a, 21b are shown in FIGS. 3A-4B, it is also possible to connect more than two printed circuit boards. For example, two stretchable interconnects could connect three printed circuit boards together in a chain, with two sides of a middle printed circuit board connected to one of the stretchable interconnects that is connected to a printed circuit board at the end of the chain. Another example is for two stretchable interconnects to be connected at one end to the same side of the same printed circuit board and at the other end to separate printed circuit boards. It is also possible to use an adhesive to more securely attach the stretchable interconnect 22 to the two printed circuit boards 21a, 21b. Any suitable adhesive can be used.

The flexible circuits 23 are preferably attached to the printed circuit boards 21a, 21b by using solder. However, the flexible circuits 23 could be attached to the printed circuit boards 21a, 21b using any suitable method. For example, the flexible circuits 23 could be attached to the printed circuit boards 21a, 21b by bonding with electrically conductive epoxy adhesive, clamping, pressure fittings, and crimping. The ends of the flexible circuits 23 preferably have an L- or a reverse L-shape. The ends of the flexible circuits 23 are preferably inserted through holes 26 in the printed circuit boards 21a, 21b. After the ends of the flexible circuits 23 are inserted through holes 26 in the printed circuit boards 21a, 21b, the ends of the flexible circuits 23 are soldered to the printed circuit boards 21a, 21b.

Figure 4C:
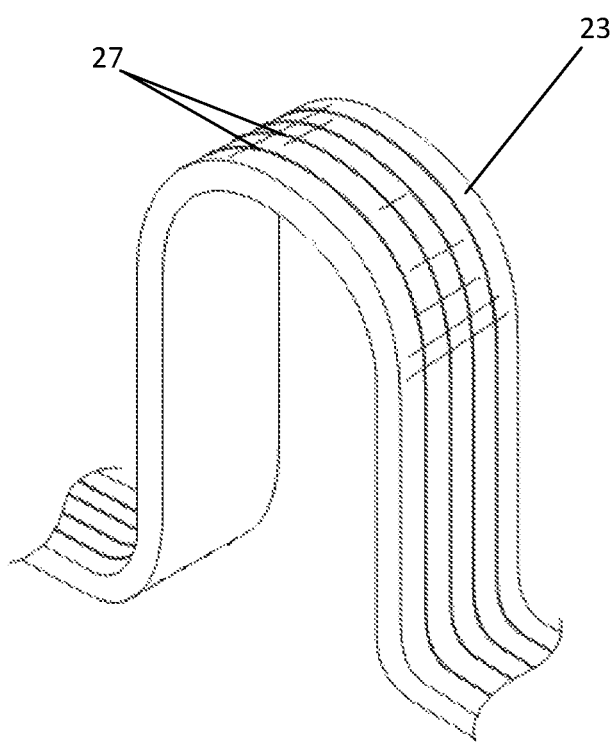
FIG. 4C is a close-up view of a flexible circuit according to a second preferred embodiment of the present invention.

Typically, the flexible circuits 23 include a flexible plastic substrate with one or more conductive lines 27 for transmitting electronic signals. FIG. 4C is close-up view of one of the flexible circuits 23 with conductive lines 27. The flexible plastic substrate can be a polyimide, a polyether ether ketone (PEEK), a transparent conductive polyester, or any other suitable flexible material. The conductive lines 27 can be made of any suitable electrically conducting material. The flexible circuits 23 can include passive and/or active components that process and/or modify the signals transmitted through the stretchable circuit assembly 10. Although not shown in the figures, it is possible to have two or more flexible circuits 23 that have the same shape when viewed in plan view but that are vertically separated from each other when viewed in a cross-sectional view. For example, two flexible circuits 23 could be used, with one of the flexible circuits 23 soldered to the top of the printed circuit boards 21a, 21b and with the other of the flexible circuits 23 soldered to the bottom of the printed circuit boards 21a, 21b. Of course, having more than one flexible circuit 23 spaced apart from each other when viewed in cross-section requires that the stretchable interconnect 22 be thicker than when only one flexible circuit 23 is used.

In FIGS. 3C and 4B, the stretchable interconnect 22 and the printed circuit boards 21a, 21b are shown as see-through so that the shape of the flexible circuits 23 can be seen. The flexible circuits 23 preferably have an oscillating shape as shown in FIGS. 3C and 4B so that shape of the flexible circuits 23 changes as the stretchable circuit assembly 20 is stretched in the direction between the printed circuit boards 21a, 21b. For example, the flexible circuits 23 can have semi-circular portions connected with linear portions as shown in FIGS. 3C and 4B. Instead of semi-circular portions, the flexible circuits 23 could have triangular portions or other similar shaped portions. It is also possible to not include linear portions in the flexible circuit 23 and to have the semi-circular portions, or other suitable shape, connected to each other. Other configurations are also possible as long as the flexible circuits 23 are not damaged and the signal integrity of the signals transmitted through the flexible circuits 23 is maintained when the stretchable interconnect 22 is stretched. The stretch range of the stretchable circuit assembly 20 is typically between 0% and about 125% of the length of the stretchable interconnect 22.

One or more of the flexible circuits 23 can be replaced by strain relief circuits 25. The strain relief wires 25 prevent the stretchable interconnect 22 from being over stretched, which protects the flexible circuits 23 from being damaged. Preferably, as shown in FIGS. 3A-4B, the top and bottom flexible circuits 23 are replaced by strain relief circuits 25. However, no strain relief circuits 25 can be used; one strain relief circuit 25, e.g., in the middle of the stretchable interconnect 22, can be used; and more than two relief circuits 25, e.g., alternating with the flexible circuits 23, can be used.

The strain relief circuits 25 are typically made of flexible circuits just as the flexible circuits 23 but without any conductive lines. However, the strain relief circuits 25 can be made of any suitable material, including, for example, a metal or carbon fiber. The strain relief circuits 25 preferably have the same shape as the flexible circuits 23 as shown in FIGS. 1A-2B; however, it also possible for the strain relief circuits 25 to have a shape different from the flexible circuits 23.

Any suitable printed circuit board can be used for the printed circuit boards 21a, 21b. Although not shown in FIGS. 2A-4B, the printed circuit boards 21a, 21b can include active and/or passive components for processing and/or modifying the signals transmitted through the stretchable circuit assembly 20. Although not shown in FIGS. 3A-4B, the printed circuit boards 21a, 21b preferably include an electrical connector for connecting the stretchable circuit assembly 20 to electrical devices with a corresponding electrical connector. The printed circuit boards 21a, 21b can be attached to an electronic device via surface mounted connectors such as board-to-board, clamping, pressure fittings, or spring pins, or can be embedded within a secondary printed circuit board, drilled, and copper plated to create a via interconnect.

Method of Making Stretchable Circuit Assembly

FIGS. 5A-8B show a method of manufacturing a stretchable circuit assembly according to a third preferred embodiment of the present invention. Although the following discussion of the method of manufacturing a stretchable circuit assembly involves the use of flexible circuits, the discussion is equally applicable to manufacturing a stretchable circuit assembly using conductive wires instead of flexible circuits, except that conductive wires are used instead of flexible circuits.

Figure 5A:
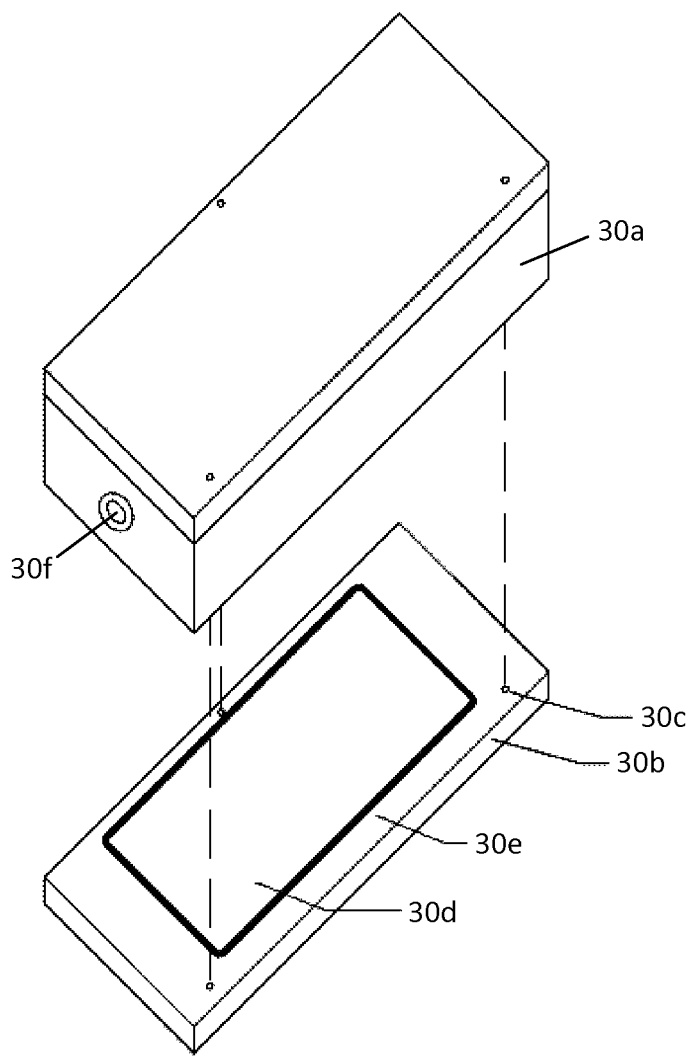

FIGS. 5A and 5B show an injection mold 30 according to a third preferred embodiment of the present invention. FIG. 5A shows an empty injection mold 30, and FIG. 5B shows an injection mold 30 with the printed circuit boards 31a, 31b and the flexible circuits 32 loaded within the injection mold 30 but before any polymer is injected into the injection mold 30. The injection mold 30 includes mold top 30a, mold core 30b, and alignment pins 30c for aligning the mold top 30a with the mold core 30b. The mold top 30a and the mold core 30b define an injection area 30d into which polymer is injected. The injection mold 30 includes a seal 30e for sealing the injection area 30d when polymer is injected into the injection mold 30. The injection mold 30 includes a hole 30f through which polymer is injected. Although only one hole 30f is shown in FIGS. 5A and 5B, the injection mold 30 can have more than one hole. For example, the injection mold 30 could have a hole on each side of the injection mold 30.

Figure 6:
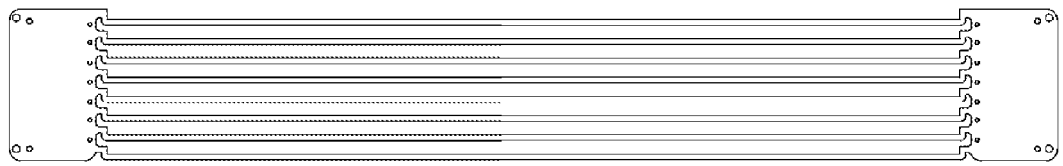
FIG. 6 shows a flexible printed circuit used in a method of manufacturing a stretchable circuit assembly according to a third preferred embodiment of the present invention.

The steps of using the injection mold 30 to manufacture a stretchable circuit assembly will now be discussed. A flexible circuit assembly 32' is manufactured as shown in FIG. 6. Any suitable method can be used to manufacture the flexible circuit assembly 32'. As explained above with respect to individual flexible circuits 23, the flexible circuit assembly 32' includes a flexible plastic substrate with one or more conductive lines for transmitting electronic signals. The flexible circuit assembly 32' can also include passive and/or active components. The flexible circuit assembly 32' is divided into individual flexible circuits 32 and formed such that the ends of the flexible circuits 32 preferably have an L- or reverse L-shape. The ends of the flexible circuits 32 are preferably arranged such that the ends are perpendicular or substantially perpendicular to the portion of the flexible circuits 32 between the ends.

Figure 7A:
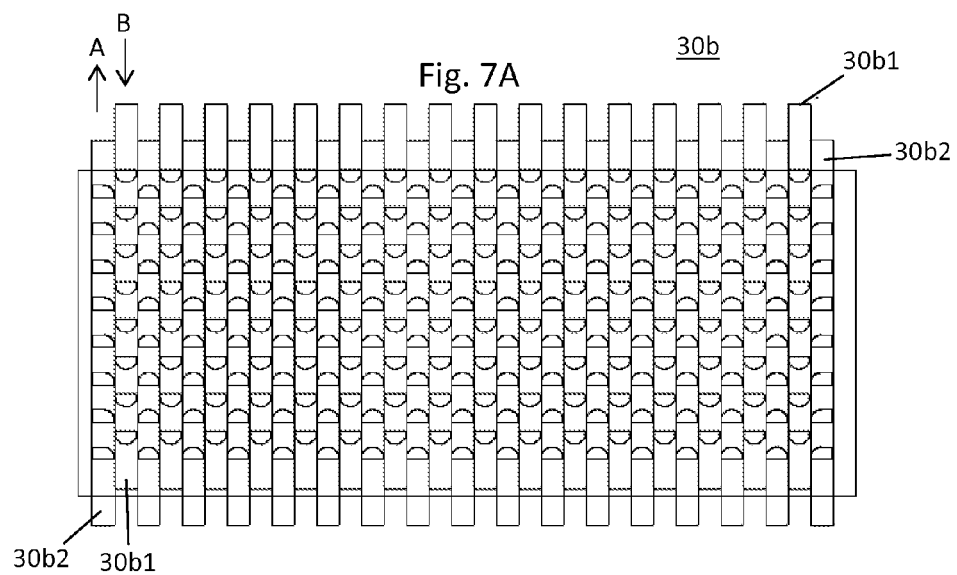
FIGS. 7A-7C show top plan views of a mold core used in a method of manufacturing a stretchable circuit assembly according to a third preferred embodiment of the present invention.
Figure 7B:
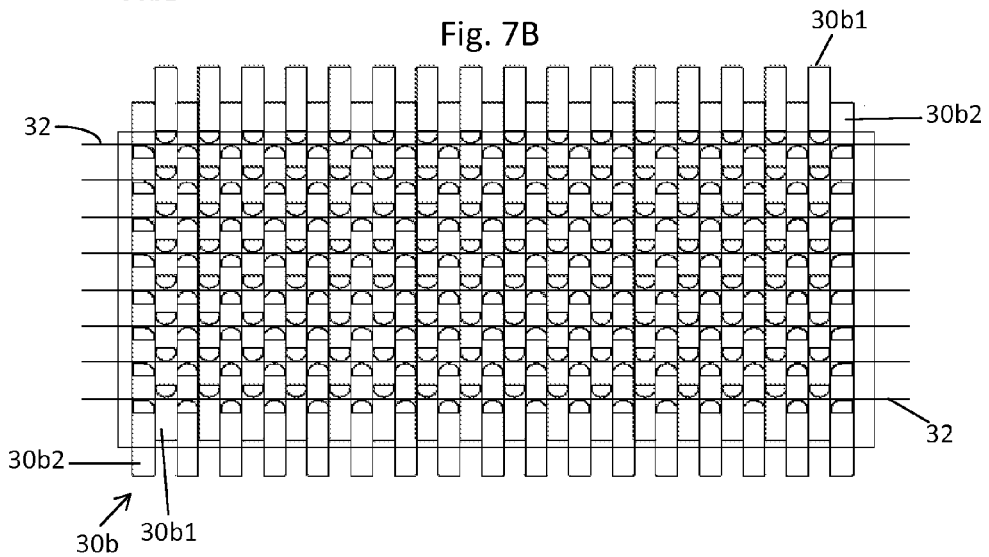
Figure 7C:
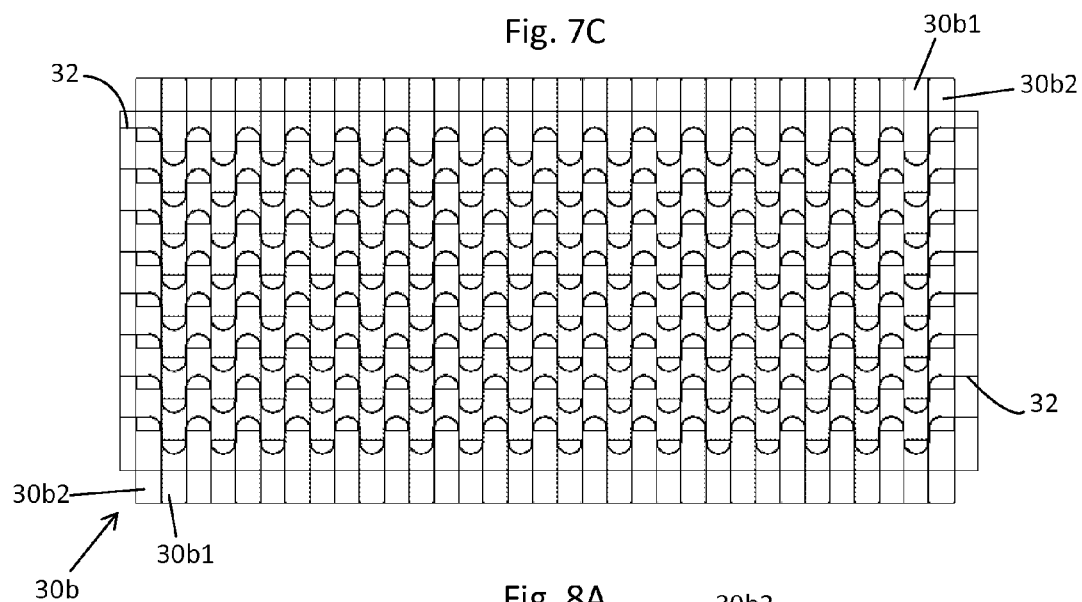

FIG. 7A shows an empty mold core 30b. The mold core 30b includes a first row of pins 30b1 and a second row of pins 30b2. The first 30b1 and second 30b2 rows of pins are moveable with respect to each other along directions A, B that are anti-parallel to each other. The pins of the first 30b1 and second 30b2 rows of pins shown in FIGS. 7A-7C are shaped to form semi-circular portions in the flexible circuits 32. However, the pins could have different shapes to form different shapes in the flexible circuits 32, as explained above.

After the flexible circuits 32 are manufactured, the flexible circuits 32 are loaded into the mold core 30b such that the flexible circuits 32 are arranged between the pins of the first 30b1 and second 30b2 rows of pins as shown in FIG. 7B. It is possible to replace one or more of the flexible circuits with strain relief circuits. After the flexible circuits 32 are loaded in the mold core 30b, the mold core 30b is closed by moving the first rows of pins 30b1 in direction B and by moving the second rows of pins 30b2 in direction A as shown in FIG. 7C. By closing the mold core 30b, the flexible circuits 32 are shaped to have an oscillating shape with semi-circular portions connected by linear portions, as discussed above. Preferably, the flexible circuits 32 are inserted into holes in the printed circuit boards 31a, 31b and are attached to the printed circuit boards 31a, 31b before any polymer is injected into the mold core 30b. As discussed above, the flexible circuits 32 are preferably soldered to the printed circuit boards 31a, 31b; however, it is possible to use other suitable methods to attach the flexible circuits 32 to the printed circuit boards 31a, 31b.

Figure 8A:
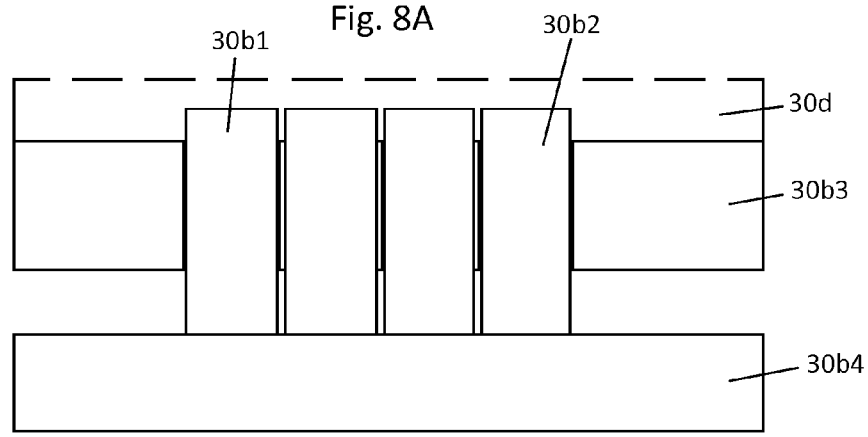
FIGS. 8A-8C shows side views of a mold core used in a method of manufacturing a stretchable circuit assembly according to a third preferred embodiment of the present invention.
Figure 8B:
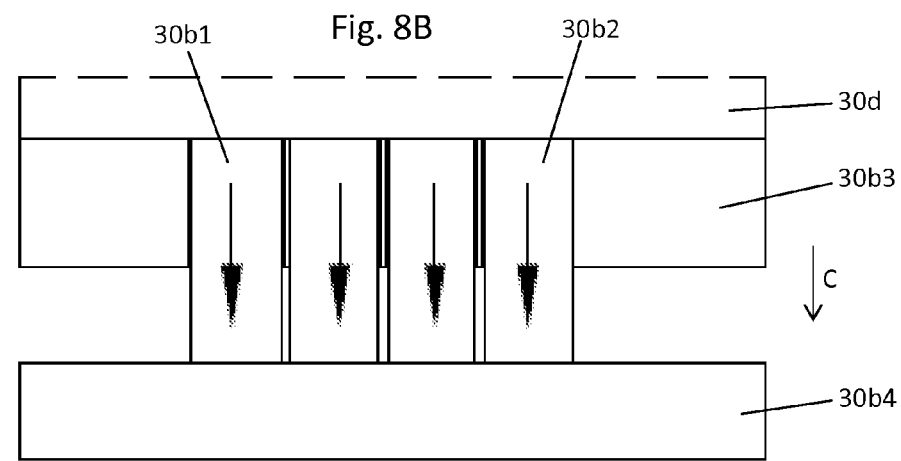
Figure 8C:
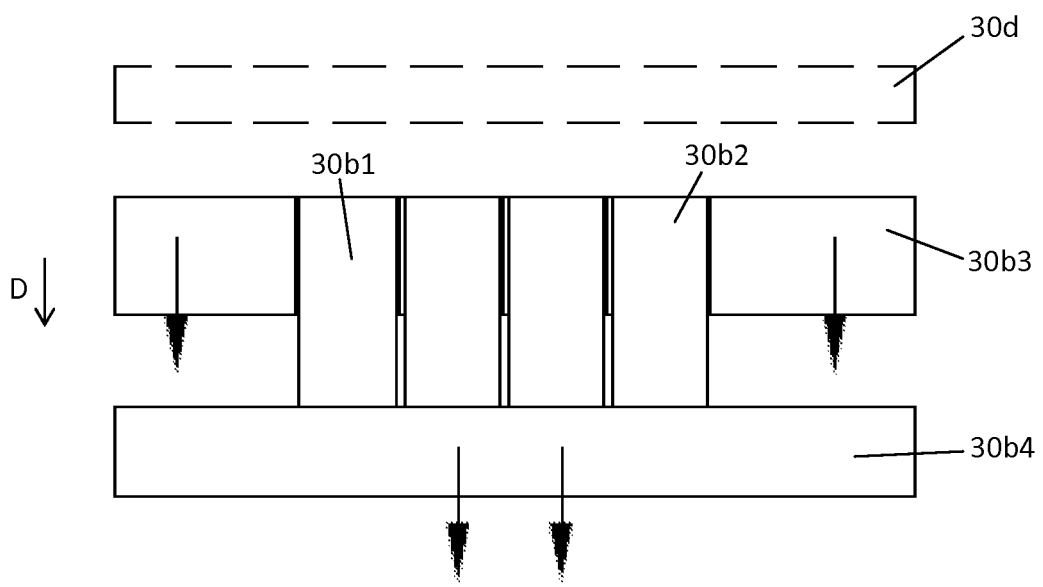

FIGS. 8A-8C are side views of the mold core 30b according to a third preferred embodiment of the present invention. The mold core 30b shown in FIGS. 8A and 8B is simplified compared to the mold core 30b shown in FIGS. 7A-7C in that the mold core 30b shown in FIGS. 8A and 8B only has four rows of pins: two first rows of pins 30b1 and two second rows of pins 30b2. The mold core 30b can have any number of first rows of pins 30b1 and of second rows of pins 30b2. In addition to the first 30b1 and second 30b2 rows of pins, the mold core 30b also includes a base 30b3 and retraction plate 30b4.

After the mold core 30b is closed, the mold core 30b is mated with the mold top 30a using alignment pins 30c. For the sake of simplicity, FIGS. 8A-8C only show the mold core 30b and the injection area 30d. After the mold core 30b and the mold top 30a are mated, a first shot of polymer is injected into injection area 30d of the injection mold 30 as shown in FIG. 8A. The first shot of polymer is allowed to set. After the first shot of polymer sets, as shown in FIG. 8B, the retraction plate 30b4 is moved in direction C so that the top of the pins of the first 30b1 and second 30b2 rows of pins are aligned with the top surface of the base 30b3.

As shown in FIG. 8C, after the top of the pins of the first 30b1 and second 30b2 rows of pins are aligned with the top surface of the base 30b3, the mold core 30, including the first 30b1 and second 30b2 rows of pins, the base 30b3, and the retraction plate 30b4, is moved in direction D so that a gap is formed between the top surface of the base 30b3 and the bottom surface of the set polymer from the first shot of polymer in the injection area 30d.

After the gap is formed between the top surface of the base 30b3 and the bottom surface of the set polymer from the first shot of polymer, a second shot of polymer is injected into the injection mold 30. The second shot of polymer is allowed to set. After the second shot of polymer is set, the injection mold 30 is opened and the stretchable circuit assembly is removed from the injection mold 30.

After the stretchable circuit assembly is removed from the injection mold 30, the stretchable circuit assembly can be cut into discrete circuits, can have secondary components assembled or connected to it, can be tested, and can have bonding operations performed on it. The bonding operations include, for example, bonding the printed circuit boards 31a, 31b of the stretchable circuit assembly to metal stiffeners, chassis, housings, or other flexible printed circuit/printed circuit board assemblies.

It should be understood that the foregoing description is only illustrative of the present invention. Various alternatives and modifications can be devised by those skilled in the art without departing from the present invention. Accordingly, the present invention is intended to embrace all such alternatives, modifications, and variances that fall within the scope of the appended claims.

What is claimed is:

1. A method of making a stretchable circuit assembly comprising the steps of:
    providing flexible circuits, a first printed circuit board, and a second printed circuit board;
    shaping the flexible circuits to have an oscillating configuration; and
    forming a stretchable interconnect such that the flexible circuits are embedded within the stretchable interconnect; wherein
    the stretchable interconnect has a thickness in a smallest dimension of the stretchable interconnect;
    each of the flexible circuits has a thickness in a smallest dimension of the flexible circuits, has a width perpendicular to the thickness of the flexible circuits, is connected to the first and second printed circuit boards, and includes two or more conductive lines that are spaced from one another along the width of the flexible circuits;
    the width of the flexible circuits is substantially the same as the thickness of the stretchable interconnect; and
    the flexible circuits are embedded in the stretchable interconnect such that the conductive lines are spaced apart from one another along the thickness direction of the stretchable interconnect and such that the thickness of the stretchable interconnect is parallel or substantially parallel to the width of the flexible circuits.

2. A method of making a stretchable circuit assembly according to claim 1, wherein the step of forming a stretchable interconnect is performed by injection molding.

3. A method of making a stretchable circuit assembly according to claim 1, wherein the step of forming a stretchable interconnect uses a polymer.

4. A method of making a stretchable circuit assembly according to claim 1, further comprising the step of attaching ends of the flexible circuits to the first printed circuit board and the second printed circuit board.

5. A method of making a stretchable circuit assembly according to claim 1, wherein a portion of the first and second printed circuit boards are embedded in the stretchable interconnect.

* * * * *